United States Patent
Ku (10) Patent No.: US 6,886,117 B2
(45) Date of Patent: Apr. 26, 2005

(54) FIELD REPAIRABLE EMBEDDED MEMORY IN SYSTEM-ON-A-CHIP

(75) Inventor: Joseph Ku, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 448 days.

(21) Appl. No.: 09/988,631

(22) Filed: Nov. 20, 2001

(65) Prior Publication Data

US 2003/0097627 A1 May 22, 2003

(51) Int. Cl.$^7$ ............................................... G11C 29/00
(52) U.S. Cl. ........................................ 714/711; 714/727
(58) Field of Search ................................ 714/711, 727, 714/710, 7, 733; 365/201; 257/678

(56) References Cited

U.S. PATENT DOCUMENTS

| | | | | |
|---|---|---|---|---|
| 3,872,291 A | * | 3/1975 | Hunter, II | 714/710 |
| 5,153,880 A | * | 10/1992 | Owen et al. | 714/710 |
| 5,161,157 A | * | 11/1992 | Owen et al. | 714/710 |
| 5,764,878 A | * | 6/1998 | Kablanian et al. | 714/7 |
| 5,835,431 A | * | 11/1998 | Miner et al. | 365/201 |
| 6,065,134 A | * | 5/2000 | Bair et al. | 714/7 |
| 6,586,823 B1 | * | 7/2003 | Ohmura et al. | 257/678 |
| 6,651,202 B1 | * | 11/2003 | Phan | 714/733 |

* cited by examiner

*Primary Examiner*—David Ton (57) ABSTRACT

Field repairable system-on-a-chip (SOC) devices are possible by including electrically programmable circuits on the device, for example in the embedded memory of the SOC device. The SOC device may undergo a conventional repair process prior to packaging the device for field operation. In addition to the conventional repair process, usage indicator may be marked prior to packaging. In the field, if the embedded memory of the SOC device fails to operate correctly, diagnostic programs may be run to identify the faulty rows and/or columns. Redundant rows and/or columns may be electrically programmed in the field to repair the SOC device. Multiple field repairs can be accomplished by using this invention.

24 Claims, 10 Drawing Sheets

FIELD REPAIRABLE EMBEDDED MEMORY IN SYSTEM-ON-A-CHIP

FIELD OF THE INVENTION

This invention relates generally to integrated circuits (ICs), and more specifically, to methods of replacing/repairing defective addressable circuit areas with redundant circuit areas.

BACKGROUND OF THE INVENTION

As the semiconductor technology advances further, such as the very-large-scale-integration (VLSI) techniques, more and more functionalities are incorporated in modern VLSI chips. This allows building of system-on-a-chip (SOC) devices. For example, microprocessors may incorporate floating point units, arithmetic-logic units, memory management units, etc. into one SOC device. Previously, these units were separately produced and connected together as part of a system. In a similar manner, more and more memory, for example the embedded memory, are also being integrated within the SOC device. Some with one-time programmable type of embedded memory such as masked ROM, others with generic memory blocks such as SRAM or DRAM perform various functions or merely serve as an on-chip storage unit.

As more functional units, including embedded memory, are integrated into a SOC device, the probability of failures occurring within the embedded memory or in other functional units increase with the increased integration. To counteract the effects of failures, redundancy is built into the embedded memory so that physical defects introduced by the fabrication process of SOC device can be fixed before packaging it for field operation.

Figure 1:
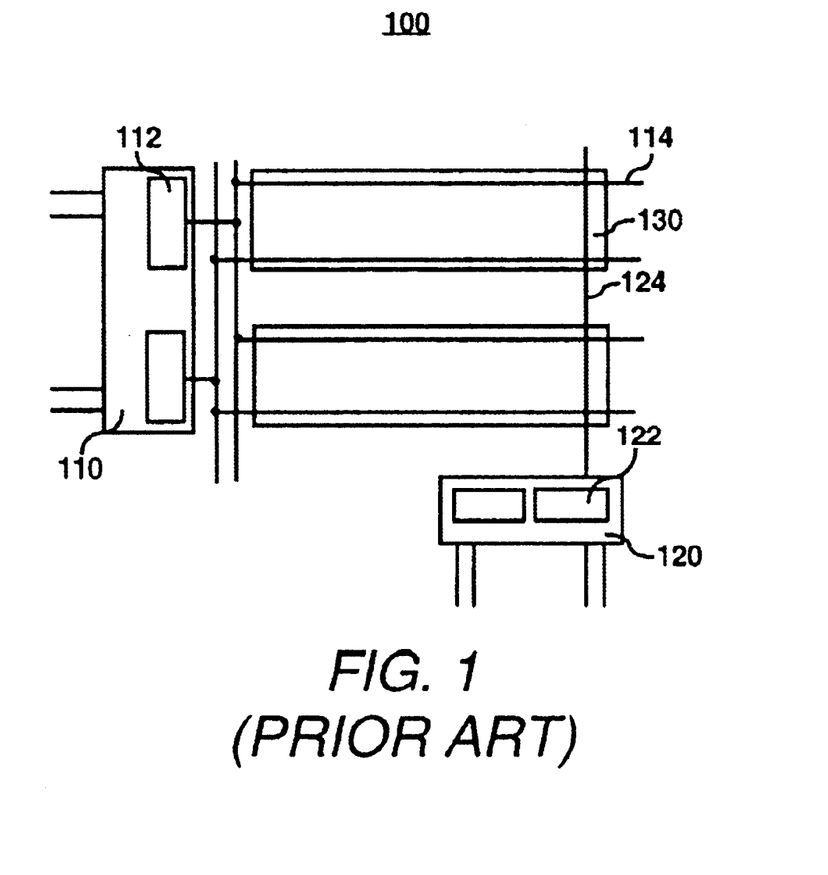
FIG. 1 illustrates a conventional redundancy configuration for a commodity memory product.

A conventional redundancy configuration 100 of the commodity memory product is shown in the FIG. 1. The conventional redundancy configuration 100 typically employees both row and column redundancies. Thus, the conventional redundancy configuration 100 typically includes spare row decoders 110 and spare column decoders 120. The spare row and column decoders 110 and 120 contain a plurality of row fuses 112 and column fuses 122, respectively. The conventional redundancy configuration 100 also includes a plurality of spare rows 114 and a plurality of spare columns 124 connected to the spare row and column decoders 110 and 120, respectively. The spare rows and columns 114 and 124, respectively, are part of memory blocks 130. The spare rows 114 substitute for defective word lines (not shown) and the spare columns 124 substitute for defective bit lines (also not shown). The conventional way to link the redundant rows and columns to the address lines is through the laser blown fuses.

Figure 2:
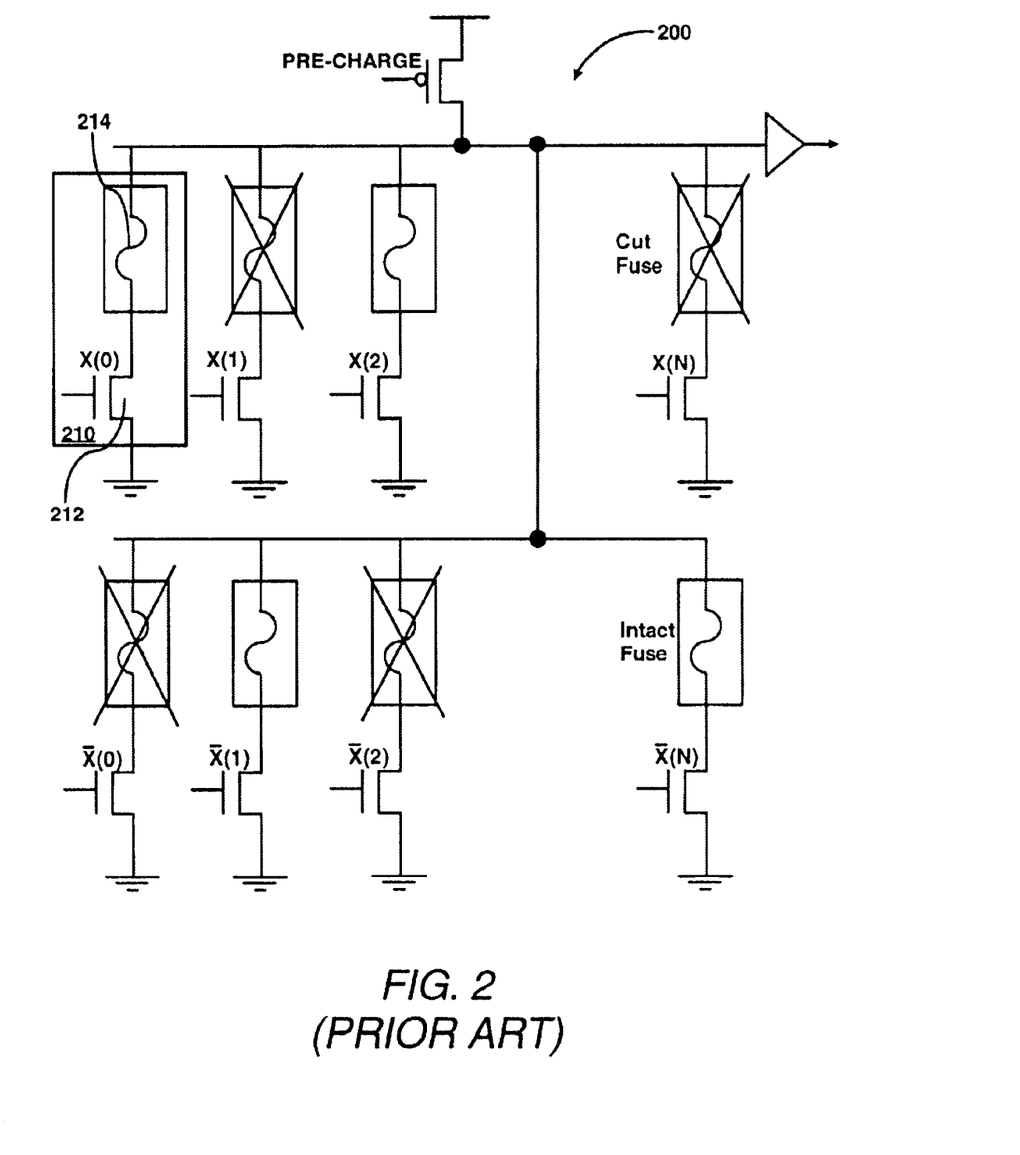
FIG. 2 illustrates a conventional row redundancy configuration to activate a redundant word line.

FIG. 2 illustrates a conventional row redundancy configuration 200 to activate a redundant word line. The conventional row redundancy configuration 200 includes two sets of row address bits 210. Each set may include a plurality of row address bits 210. The first set represents true row address values ($X_N$ to $X_0$) and the second set corresponds to complementary row address value (~$X_N$ to ~$X_0$). As shown in FIG. 2, each row address bit circuit 210 consists of a transistor 212 serially connected to a fuse 214.

The operation of the conventional row redundancy configuration 200 is explained as follows. In FIG. 2, it is assumed that a word line with address $X_N$ . . . $X_2X_1X_0$=10 . . . 010 is defective and needs to be replaced with a redundant row (not shown). In this situation, fuses 214 of the row address bits $X_N$ and $X_1$ (from the first set) and their complementary bits ~$X_{N-1}$, . . . ~$X_2$, and ~$X_0$ (from the second set) are blown. As a result, the redundant word line is activated and the defective word line is deselected.

In this type of row redundancy scheme, to support one redundant word line, the number of fuses required is twice the number of bits per row address. For example, if the memory block has a 10 bit row address, 20 fuses are required to support one redundant word line.

Figure 3:
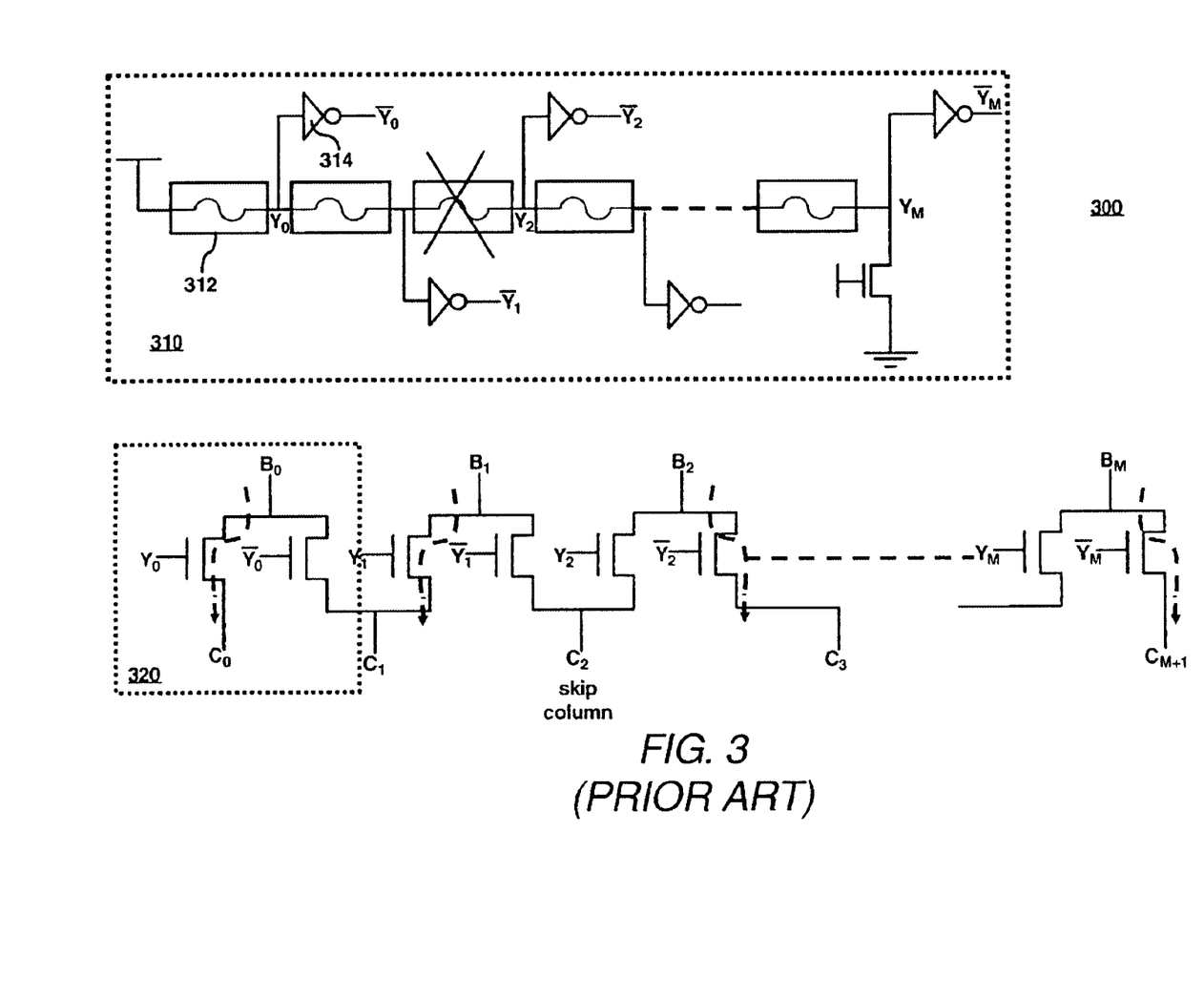
FIG. 3 illustrates a conventional column redundancy configuration to activate a redundant bit line.

FIG. 3 illustrates a conventional column redundancy configuration 300 to activate a redundant column. The column redundancy uses different method than the row redundancy described above, called "shift redundancy", to substitute the defective bit lines. It is called "shift redundancy" because the method skips a defective column and shifts to an adjacent column. The shift redundancy method uses fewer fuses to support redundancy than the row redundancy described above.

Referring again to FIG. 3, the conventional column redundancy configuration 300 includes a redirect control signal generator 310, which generates redirect control signals $Y=Y_M$ . . . $Y_2Y_1Y_0$. The redirect control signal generator 310 includes fuses 312 that are serially connected to each other. As shown, the redirect control signal generator 310 also includes inverters 314, which produce complimentary redirect control signal ~$Y$=~$Y_M$ . . . ~$Y_2$~$Y_1$~$Y_0$. The column redundancy configuration 300 also includes a plurality of multiplexors 320. Each multiplexor 320 directs a bit of the column address decoded lines to one of two column select lines.

The operation of the conventional column redundancy configuration 300 is explained as follows. In FIG. 3, it is assumed that column $C_2$ is defective. In this instance, the fuse between nodes $Y_1$ and $Y_2$ is blown open. As a result, bits $Y_1$ and $Y_0$ of the redirect control signal Y signal are high since these nodes are tied to high voltage VDD (correspondingly, the bits ~$Y_1$ and ~$Y_0$ of the complimentary redirect control signal ~Y are both low). Also, bits $Y_M$ . . . $Y_2$ are low since these are tied to ground (~$Y_M$ . . . ~$Y_2$ are high). The redirect control signals Y and the complimentary redirect control signals ~Y control the plurality of multiplexors 320. In this instance, the Y signals $Y_M$ . . . $Y_2Y_1Y_0$=0 . . . 0011 redirect the column address decoded lines $B_M$ . . . $B_0$ to skip column $C_2$. In other words, signals from $B_M$ . . . $B_2$ are shifted to columns $C_{M+1}$ . . . $C_3$. As a result, the signals $B_M$ . . . $B_0$ are transmitted through columns $C_{M+1}$ . . . $C_3C_1C_0$.

The row and column redundancy schemes represented by FIGS. 1, 2 and 3 are used to correct errors in the conventional memory device as well as in the embedded memory of the SOC device prior to packaging. As mentioned above, the conventional way to link the redundant rows and columns to the address lines is through blowing the fuses by a laser. Once the errors are corrected, the SOC device is packaged for field operation.

However, there is no conventional way to deal with errors that occur in the field other than to replace the SOC device. In other words, the conventional design of SOC devices does not allow for field reparability. As more and more functionalities are built into the SOC device, the cost of the device increases. Thus the replacement strategy can become very expensive.

SUMMARY OF THE INVENTION

In one aspect of the present invention, an electrically programming and sensing unit (EPSU) for a field repairable system-on-a-chip (SOC) device may include a diode whose cathode is connected to a VDD power and an electrically programmable element with a first end connected to an anode of the diode and to a VPP power. In this configuration, the diode acts to isolate the VPP power from the VDD power. The EPSU may also include a pull-down transistor configured to conduct current from the VDD power or from the VPP power to ground through the electrically programmable element when the pull-down resistor is turned on. The EPSU may further include a latch configured to latch a value from a second end of the electrically programmable element. The EPSU may still further include a multiplexor configured to receive a set of external inputs and to control the operation of the pull-down transistor based on the set of external inputs.

In another aspect of the present invention, an electrically programmable circuit for a field repairable system-on-a-chip (SOC) device may include a high voltage generator configured to supply a VPP power in response to a program_enable signal. The electrically programmable circuit may also include a scan chain configured to receive address bits indicating whether a redundant row or a column needs to be activated. The electrically programmable circuit may further include an EPSU configured to receive a signal from the scan chain, the program_enable signal, and a power-on-reset signal. The EPSU may also be configured to be programmed in response to the signal from the scan chain indicating a defective row or column should be fixed. The electrically programmable circuit may still further include a fuse-switch configured to receive an output of the EPSU such that the EPSU is able to activate/deactivate the fuse-switch.

In a further aspect of the present invention, a field-repairable system-on-a-chip (SOC) device may include at least one of a plurality of redundant rows (610) and a plurality of redundant columns (620), wherein each of the redundant row (610) or the redundant column (620) includes a plurality of fuse boxes. Each fuse box may include an EPSU connected a fuse-switch. The SOC device may also include a plurality of usage indicators configured to indicate that a corresponding redundant row or a corresponding redundant column is in use. The SOC device may further include a fuse map sensing circuit configured to sense and record the plurality of usage indicators and include a fuse map scan chain flip flops configured to send out data sensed by the fuse map sensing circuit.

In yet another aspect of the present invention, a method to package a field-repairable SOC device at a factory may include repairing the SOC device, using one or both of redundant rows and columns, prior to packaging the device. The method may also include marking the usage of all redundant rows and columns. The method may further include retesting and packaging the SOC device.

In a yet further aspect of the present invention, a method to repair a field-repairable system-on-a-chip (SOC) device may include performing a diagnostic test on the SOC device. The method may also include identifying unused redundant rows and columns and electrically programming to activate any of the unused redundant rows and columns and to deactivate defective rows and columns. The method may further include retesting the SOC device.

DETAILED DESCRIPTION

For simplicity and illustrative purposes, the principles of the present invention are described by referring mainly to exemplary embodiments thereof. However, one of ordinary skill in the art would readily recognize that the same principles are equally applicable to many types of devices that may benefit from field reparability.

Figure 4A:
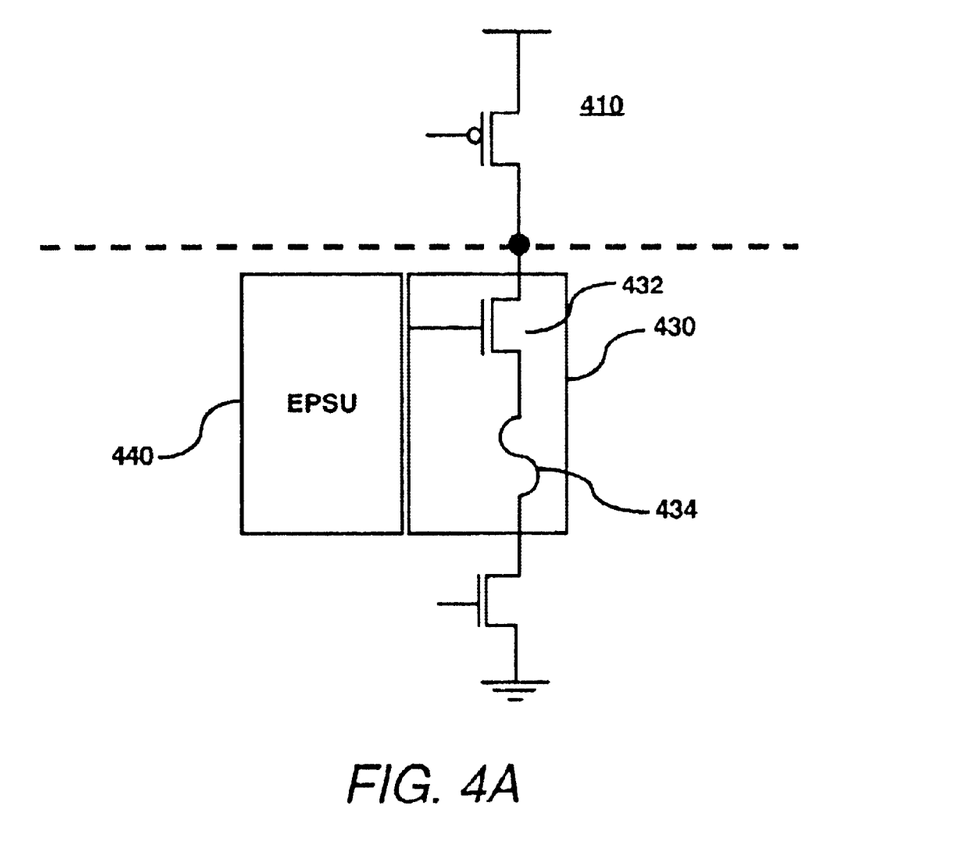
FIGS. 4A and 4B illustrate exemplary embodiments of row and column redundancy fuse boxes, respectively, according to an aspect of the present invention.
Figure 4B:
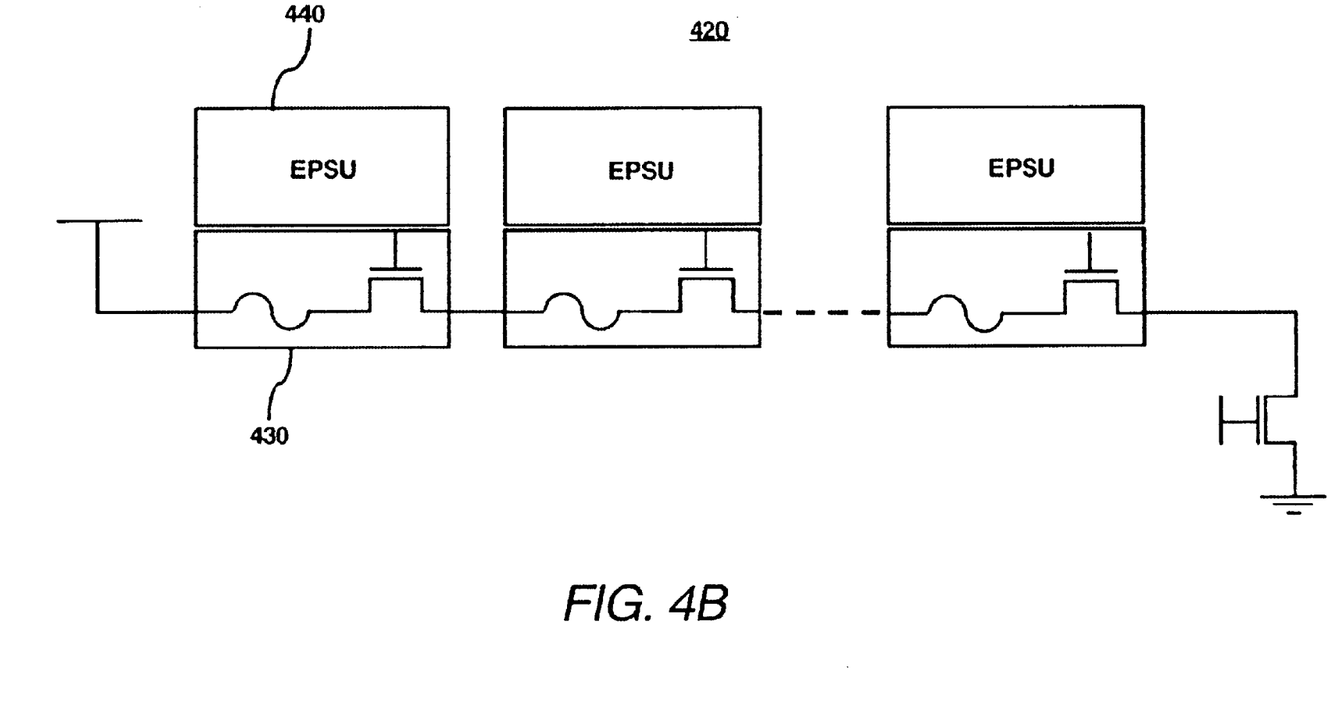

In one aspect, electrically programmable devices are incorporated to enable field-reparability after the SOC device is assembled and packaged. FIGS. 4A and 4B illustrate exemplary embodiments of row and column redundancy fuse boxes, respectively, according to an aspect of the present invention. A redundant row address bit 410 is shown in FIG. 4A and a column redirect control signal generator 420 is shown in FIG. 4B. In both the redundant row address bit 410 and the column redirect control signal generator 420, each conventional fuse (214 for row configuration, see FIG. 2; 312 for column configuration, see FIG. 3) may be replaced with a fuse-switch 430. The fuse-switch 430 may include a switch 432 in series with a fuse 434. The switch 432 may be transistor such as NMOS, PMOS, bipolar, etc. (In this instance, NMOS is shown). The fuse 434 may be a conventional fuse, which can be blown by a laser. Each fuse-switch 430 may be controlled by an electrically programming and sensing unit (EPSU) 440 as will be shown below.

Figure 5:
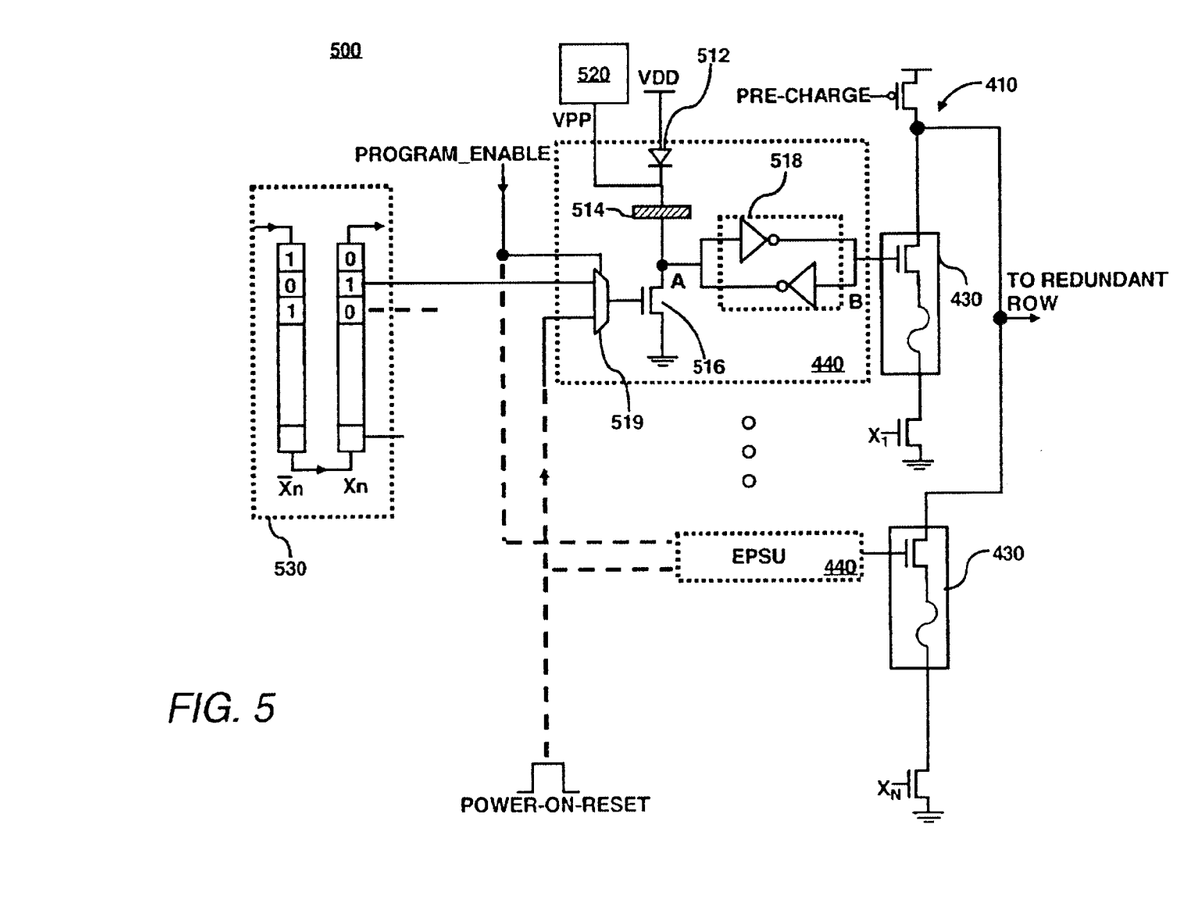
FIG. 5 illustrates an exemplary embodiment of an electrically programmable circuit according to another aspect of the present invention.

FIG. 5 illustrates an exemplary embodiment of an electrically programmable circuit 500, including a detailed illustration of an exemplary EPSU 440, according to another aspect of the present invention. In FIG. 5, a row redundancy scheme is assumed. However, one of ordinary skill in the arts will be able readily adapt the embodiment to a column redundancy scheme. As shown, the electrically programmable circuit 500 may include the EPSU 440. The output of the EPSU 440 controls the fuse-switch 430 and thus controls row address bit 410. Although not shown, the EPSU 440 may also control the redirect control signal generator 420 (for column redundancy) shown in FIG. 4.

The electrically programmable circuit 500 may also include the high voltage generator 520 generating the programming power VPP, which may be connected to the EPSU 440 as shown. The electrically programmable circuit 500 may further include a scan chain 530 connected to the EPSU 440.

Referring to the exemplary EPSU 440 individually, the EPSU 440 may include a diode 512 serially connected to an electrically programmable element 514. In the embodiment as shown, the diode 512 acts to isolate the regular power VDD from the programming power VPP. The electrically programmable element 514 may be a fuse (initial low resistance, programmed high resistance) or an anti-fuse (initial high resistance, programmed low resistance). The anti-fuses may be formed from materials such as poly3/thin oxide/poly4, poly silicon, metal/thin oxide/metal, or the like. Other one-time programmable (OTP) devices may be used such as EPROM, EEPROM, Flash, and the like.

Also as shown in FIG. 5, the EPSU 440 may also include a pull-down transistor 516 connected to the programmable element 514. The pull-down transistor 516 maybe NMOS. It is preferred that the initial and programmed resistances of the electrically programmable element 514 be different by at least two orders of magnitude (about 100 fold), and the turn-on resistance of the pull-down transistor 516 be in between the two. For example, assume that the electrically programmable element 514 is an anti-fuse. Then the turn-on resistance of the pull-down transistor 516 is preferred to be at least 10 times the resistance of the programmed anti-fuse (low resistance), and a maximum of $1/10^{th}$ the initial resistance of the anti-fuse (large resistance). This enhances the reliability of the programmed value to be saved to a latch 518, which is connected to node A as shown.

The EPSU 440 may further include a multiplexor 519 whose inputs may be connected to the scan chain 530, power-on-reset signal, and the program_enable signal as shown in FIG. 5. The output of the multiplexor 519 may be connected to the pull-down transistor 516 of the EPSU 440.

With reference to FIG. 5, the operation of the electrically programmable circuit 500 is explained. When a working device is found to be defective in the field, a diagnostic test may be run to identify the faulty address location. Then a fuse (redundant column case) or a group of fuses (redundant row case) are allocated. In the actual repair procedure, an address with known defective locations may be shifted through the scan chain 530. As illustrated in the FIG. 5, the intended programming locations may have 1's and the rest may have 0's. After the designated address of the defective location is shifted in, the "program_enable" signal may be switched on. When the program_enable signal is on, the output of the multiplexor 519 follows the value of the bit in the scan chain 530 connected to the multiplexor 519. In this instance, the output of the multiplexor 519 turns on the pull-down transistor 516 of the EPSU 440.

The program_enable signal also initiates that high-voltage generator 520 to generate the programming power VPP. As a result, a programming current is conducted through the electrically programmable element 514, which changes the resistance state of the electrically programmable element 514. For example, if the electrically programmable element 514 is an anti-fuse, the initial high resistance may be changed to the programmed low resistance state. The changing of the state of the electrically programmable element 514 completes the repair work. The duration of VPP application depends on the type of the materials used to form the electrically programmable element. At this point, addressing to the defective locations is re-directed to redundant row or column.

When a device is powered up afterwards, a "power-on-reset" signal causes the correction to be sensed as follows. If the electrically programmable element 514 is an anti-fuse and the anti-fuse has been programmed, node "A" of the latch will have a "1" latched. As a result, node "B" will have a "0", which in turn will turn off the fuse-switch 430 by turning off the switch 432. At the same time, a redundant row (or column, not shown) is activated.

Figure 6A:
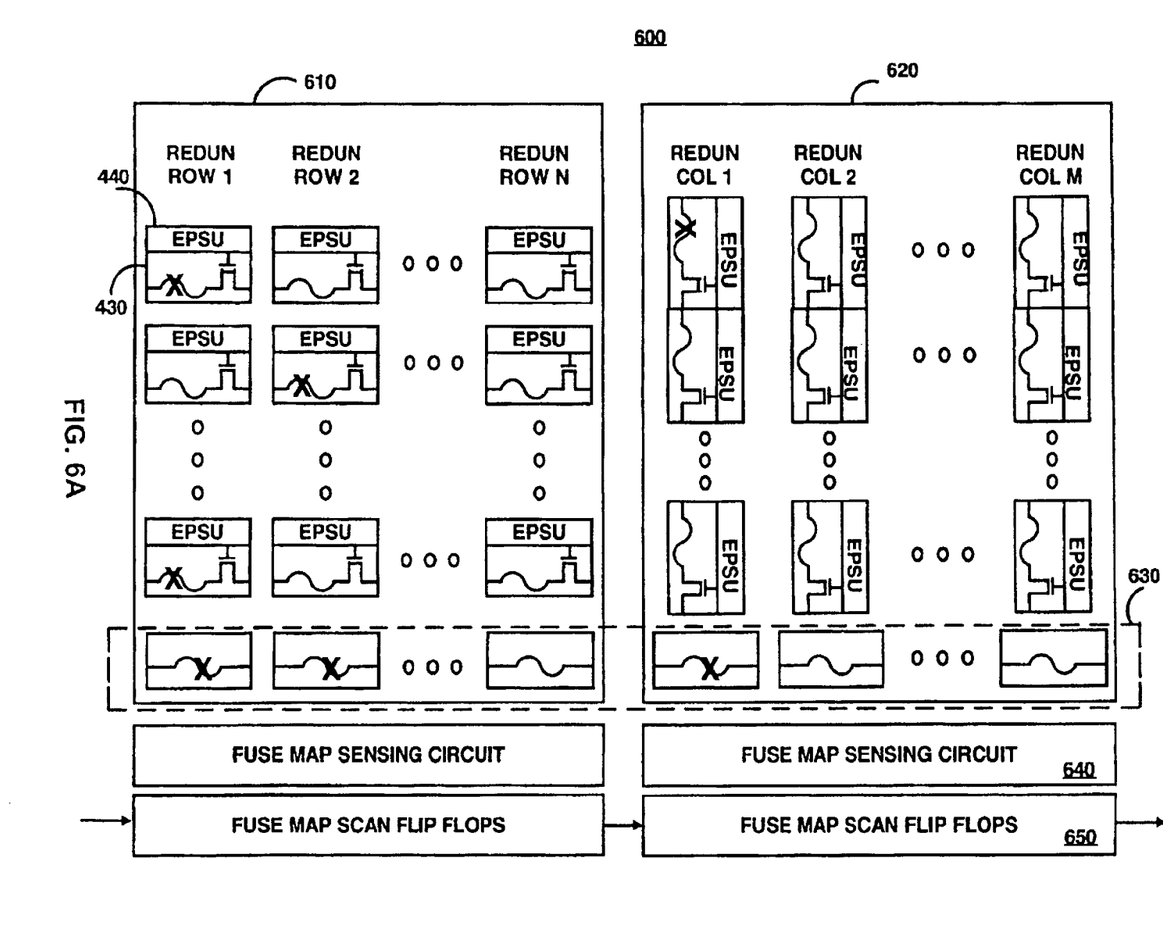
FIG. 6A illustrates an exemplary embodiment of a field repairable redundancy configuration of an integrated memory circuit according to yet another aspect of the present invention.

FIG. 6A illustrates an exemplary embodiment of field repairable memory circuit 600 according to yet another embodiment of the present invention. As shown, the field repairable memory circuit 600 may include a plurality of redundant rows 610 and a plurality of redundant columns 620. Each redundant row 610 or column 620 may include a group of fuse boxes, wherein each fuse-box may include a fuse-switch 430 and EPSU 440, such as shown in FIG. 4.

The field repairable memory circuit 600 may also include a plurality of redundancy usage indicators 630, at least one for each group of fuse boxes for the redundant rows 610 or the redundant columns 620. The field repairable memory circuit 600 may undergo a conventional memory test and repair in their manufacturing process. When the conventional laser repairing work is done, the set of fuses of the redundancy usage indicator 630 may be blown to record the locations of the redundant rows and columns used in the manufacture laser repair. The use of the redundancy usage indicator 630 greatly enhances the efficiency of the field repair.

Figure 6B:
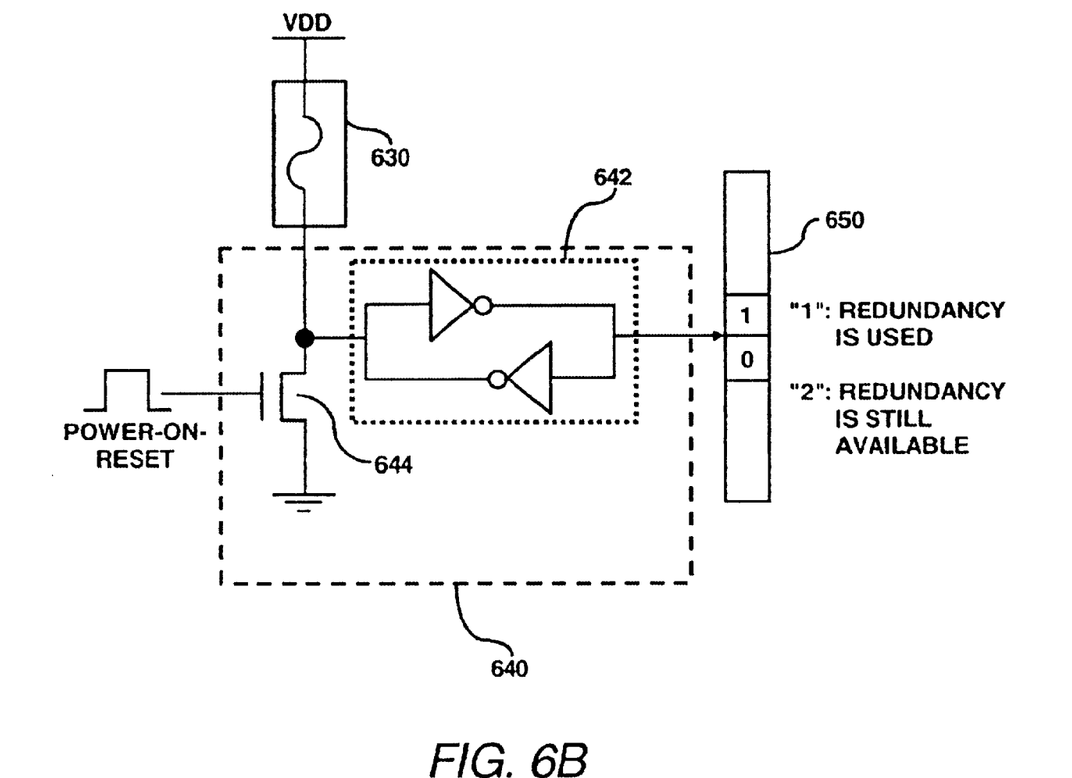
FIG. 6B illustrates an exemplary embodiment of the fuse map sensing circuit of FIG. 6A according to an aspect of the present invention.

The field repairable memory circuit 600 may further include one or more fuse map sensing circuits 640 and one or more fuse map scan flip flops 650. The fuse map sensing circuits 640 and the fuse map scan flip flops 650 may be used to indicate the status of redundancy usage of the SOC device. FIG. 6B illustrates an exemplary embodiment of the fuse map sensing circuit 640 of FIG. 6A according to an aspect of the present invention. The operation of the fuse map sensing circuit 640 is explained with respect to FIG. 6B.

As shown in FIG. 6B, the fuse map sensing circuit 640 may include a latch 642 and a transistor 644 corresponding to each redundant row or column. Again, the transistor 644 may be NMOS. Assume that a particular redundant row (or column) has been used for repair during the factory repair process prior to packaging. In this case, the usage indicator 630 for that particular redundant row (or column) would be blown (assume the indicator 630 is a fuse). Then upon the power-on-reset signal being applied, the value of "1" will be sensed and saved to the associated latch, and subsequently written to the corresponding location of the fuse map scan chain flip flop 650 when the scan protocol is initiated. The value of "1" indicates that the particular redundant row or column is already in use. On the other hand, if the particular row (or column) is available, a "0" would be sensed and saved to the fuse map scan chain flip flop 650. Again, it is preferred that the turn-on resistance of the transistor 644 be appropriately proportioned to the initial and programmed resistances of the usage indicator 630.

Figure 8A:
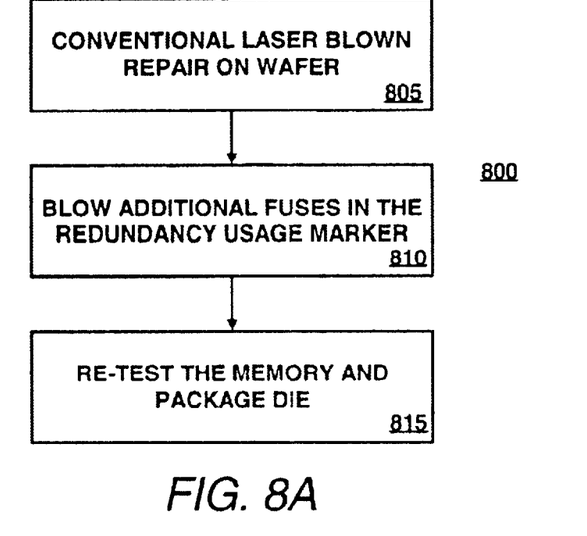
FIG. 8A illustrates an exemplary embodiment of a method for repairing and assembling a SOC device with field repairable redundancy configuration of FIG. 6 before shipping to the field.

An exemplary embodiment of a method for factory repair of a SOC device using the field repairable memory circuit 600 is shown in FIG. 8A. In the factory, the SOC device may undergo a conventional laser blown repair process (step 805). For any redundant row or column used, the corresponding usage indicator 630 may be blown (step 810). As noted above, this greatly enhances the field repair process (see FIG. 8B) that may take place later on. Once the factory repairing process is complete, the device may be retested and packaged for field operation (step 815).

Note that data may be collected during the factory repair stage. The collected data may be used for a variety of purposes. For example, the data may be kept in the factory's data base for product warranty information. The data may be provided to the customer for their future reference.

Figure 7:
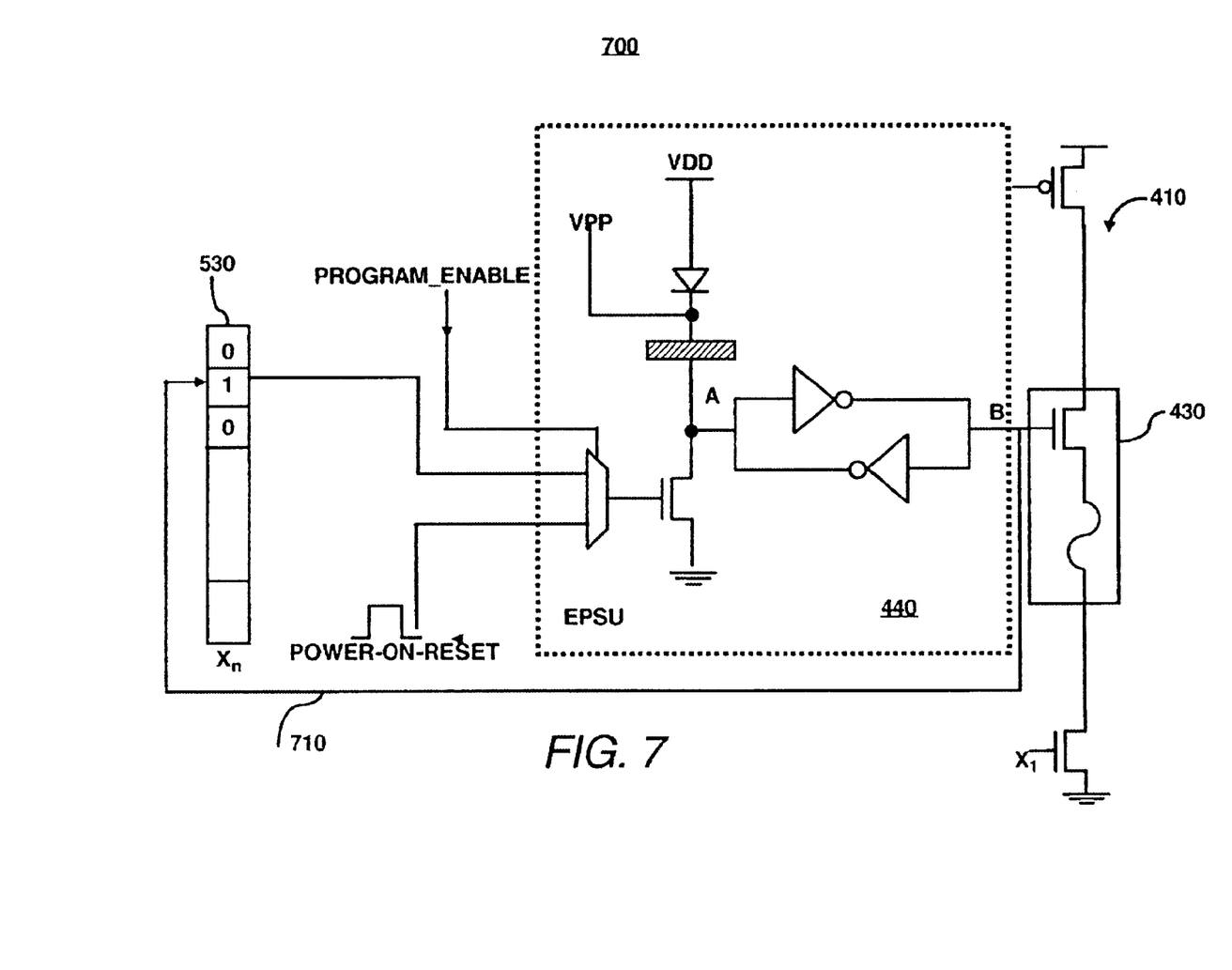
FIG. 7 illustrates a second embodiment of an electrically programmable circuit which may search for available redundancy after field repair according to still yet another aspect of the present invention.

FIG. 7 illustrates a second embodiment of an electrically programmable circuit 700. The second embodiment of the electrically programmable circuit 700 may be similar to the electrically programmable circuit 500 of FIG. 5. In other words, the second embodiment 700 may include an EPSU 440 (along with the corresponding diode, electrically programmable element, pull-down transistor, latch, and the multiplexor), a high voltage generator 520, and a row bit 410 (along with the corresponding fuse-switch). The second embodiment may also include a scan chain 530.

In addition, the second embodiment 700 may include a feedback 710 connecting an output of the node B of the EPSU 440 (output of the latch) back to the scan chain 530. By adding the signal connection from the EPSU 440 to a parallel input of the scan chain 530, the status of all electrically programmable elements of the EPSU 440 may be detected when the SOC device is powered up. For example, upon power up, the status of the EPSU 440 may be recorded in the scan chain 530. During the initialization of the SOC device, the contents of the scan chain 530 may be downloaded. This data, along with data from the fuse map scan flip flops 650 (see FIGS. 6A and 6B) provides knowledge of the previous repairs that have been performed, which in turn enables further repairs to be performed if the device is still repairable. In this manner, multiple field repairs could be accomplished.

The second embodiment 700 is capable of performing all operations that the first embodiment 500 is capable of, and thus detailed discussion of these operations is omitted. Again in FIG. 7, a row redundancy scheme is shown. However, one of ordinary skill in the arts will be able readily adapt the second embodiment 700 to a column redundancy scheme.

Figure 8B:
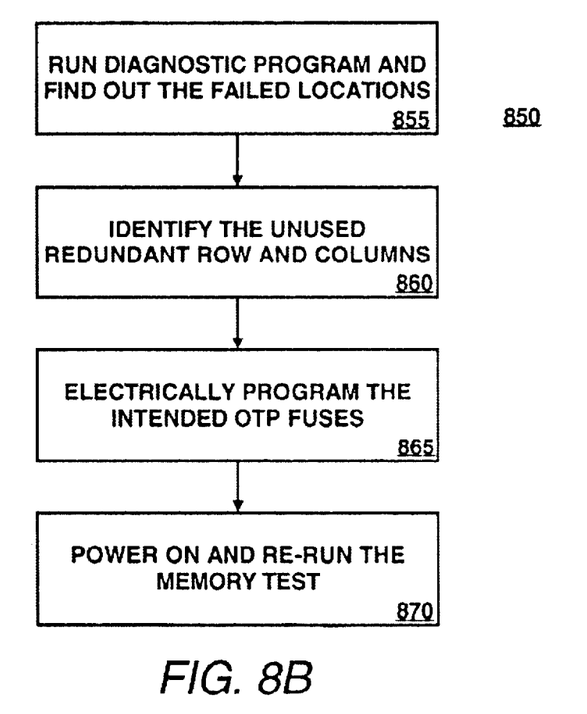
FIG. 8B illustrates an exemplary embodiment of a method for field repairing a SOC device with field repairable redundancy configuration.

FIG. 8B illustrates an exemplary embodiment of a method 850 for field repairing an SOC device according to an aspect of the present invention. First, a diagnostic program may be run to determined failed locations (step 855). Also, unused redundant rows and columns may be identified (step 860). Standard protocols exist to check the redundancy usage indicators 630 and the status of the overall available redundant rows and columns such as the IEEE 1149.1, which is preferred. Also, the "signature/roll call" mode designed by Siemens is available to locate laser repaired redundancy of the chip.

Using the unused redundant rows and columns, the electrically programmable element (fuse or anti-fuse) may be appropriately programmed to utilize the redundancy (step 865). Then the SOC device may be tested to ensure that the fixes worked correctly (step 870). As discussed above, the field repair process may be repeated until the supply of redundant rows and columns are exhausted in the SOC device.

Although embedded memory has been used to illustrate field repairability, this scheme is certainly not limited to the memory block. It can be extended to any system level redundant blocks such as symmetric multi-processor on a chip.

What has been described and illustrated herein is a preferred embodiment of the present invention along with some of its variations. The terms, descriptions and figures used herein are set forth by way of illustration only and are not meant as limitations. Those skilled in the art will recognize that many variations are possible within the spirit and scope of the present invention, which is intended to be defined by the following claims—and their equivalents—in which all terms are meant in their broadest reasonable sense unless otherwise indicated.

What is claimed is:

1. An electrically programming & sensing unit for a field repairable system-on-a-chip (SOC) device, said electrically programming & sensing unit comprising:
    a diode such that a cathode of said diode is connected to a VDD power;
    an electrically programmable element with a first end connected to an anode of said diode and to a VPP power;
    a pull-down transistor configured to conduct current from said VDD power or from said VPP power to ground through said electrically programmable element when turned on;
    a latch configured to latch a value from a second end of said electrically programmable element; and
    a multiplexor configured to receive a set of external inputs and to control the operation of said pull-down transistor based on said set of external inputs.

2. The electrically programming & sensing unit of claim 1, wherein said electrically programmable element has an initial state that is one of a high resistance and a low resistance and has a programmed state that is the other of said high resistance and said low resistance.

3. The electrically programming & sensing unit of claim 2, wherein a turn-on resistance of said pull-down transistor is substantially at least 10 times of said low resistance and is substantially at maximum $\frac{1}{10}^{th}$ of said high resistance.

4. An electrically programmable circuit for a field repairable system-on-a-chip (SOC) device, comprising:
    a high voltage generator configured to supply a VPP power in response to a program_enable signal;
    a scan chain configured to receive address bits indicating whether a redundant row or a column needs to be activated;
    an electrically programming & sensing unit configured to receive a signal from said scan chain, said program_enable signal, and a power-on-reset signal such that upon activation of said program_enable signal, said electrically programming & sensing unit further configured to be programmed in response to said signal from said scan chain indicating a defective row or column should be fixed; and
    a fuse-switch configured to receive an output of said electrically programming & sensing unit such that said electrically programming & sensing unit is able to activate/deactivate said fuse-switch.

5. The electrically programmable circuit of claim 4, further comprises a feedback connection from an output of said electrically programming & sensing unit to said scan chain.

6. The electrically programmable circuit of claim 4, wherein said electrically programming & sensing unit comprises:
    a diode such that a cathode of said diode is connected to a VDD power;
    an electrically programmable element with a first end connected to an anode of said diode and to said VPP power;

a pull-down transistor configured to conduct current from said VDD power or from said VPP power to ground through said electrically programmable element when turned on;

a latch configured to latch a value from a second end of said electrically programmable element; and a multiplexor configured to:
receive said program_enable signal and said signal from said scan chain; and
output a signal which follows said signal from said scan chain to said pull-down transistor upon activation of said program_enable signal.

7. The electrically programmable circuit of claim 6, wherein said multiplexor is further configured to:
receive said power-on-reset signal; and
output a signal which follows said power-on-reset signal to said pull-down transistor upon deactivation of said program_enable signal.

8. The electrically programmable circuit of claim 6, wherein said electrically programmable element has an initial state that is one of high resistance and low resistance and has a programmed state that is the other of said high resistance and said low resistance.

9. The electrically programmable circuit of claim 8, wherein a turn-on resistance of said pull-down transistor is substantially at least 10 times of said low resistance and is substantially at maximum $\frac{1}{10}^{th}$ of said high resistance.

10. The electrically programmable circuit of claim 6, wherein said pull-down transistor is an NMOS transistor.

11. The electrically programmable circuit of claim 4, wherein said fuse-switch comprises:
a fuse; and
a transistor configured to conduct current through said fuse when activated.

12. The electrically programmable circuit of claim 11, wherein said transistor of said fuse-switch is one of NMOS, PMOS, and bipolar transistor.

13. The electrically programmable circuit of claim 4, wherein said scan chain comprises a plurality of flip-flops.

14. A field-repairable system-on-a-chip (SOC) device, comprising:
at least one of a plurality of redundant rows and a plurality of redundant columns, wherein each of said redundant row or said redundant column includes a plurality of fuse boxes;
a plurality of usage indicators configured to indicate that corresponding redundant rows or corresponding redundant columns are in use;
a fuse map sensing circuit configured to sense and save data of said plurality of usage indicators; and
a fuse map scan chain configured to send out data sensed by said fuse map sensing circuit.

15. The field-repairable SOC device of claim 14, wherein each of said fuse boxes for said redundant rows and said redundant columns includes:
a fuse-switch; and
an electrically programming & sensing unit configured to control said fuse-switch.

16. The field-repairable SOC device of claim 14, wherein each of said usage indicators comprises a fuse.

17. The field-repairable SOC device of claim 14, wherein said fuse mapping circuit comprises:
a latch configured to latch value of said usage indicator; and
a transistor configured to cause said latch to latch the value of said usage indicator.

18. The field-repairable SOC device of claim 14, further comprising:
a high voltage generator configured to supply a VPP power in response to a program_enable signal;
a scan chain configured to receive address bits indicating of word and bit lines that should be corrected; and
a plurality of electrically programmable circuits, wherein each of said electrically programmable circuit comprises:
an electrically programming & sensing unit configured to receive a signal from said scan chain, said program_enable signal, and a power-on-reset signal such that upon activation of said program_enable signal, said electrically programming & sensing unit further configured to be programmed in response to said signal from said scan chain indicating a defective row or column should be fixed; and
a fuse-switch configured to receive an output of said electrically programming & sensing unit such that said electrically programming & sensing unit is able to activate/deactivate said fuse-switch.

19. The field-repairable SOC device of claim 18, wherein said electrically programming & sensing unit comprises:
a diode such that a cathode of said diode is connected to a VDD power;
an electrically programmable element with a first end connected to an anode of said diode and to said VPP power;
a pull-down transistor configured to conduct current from said VDD power or from said VPP power to ground through said electrically programmable element when turned on;
a latch configured to latch a value from a second end of said electrically programmable element; and
a multiplexor configured to:
receive said program_enable signal and said signal from said scan chain; and
output a signal which follows said signal from said scan chain to said pull-down transistor upon activation of said program_enable signal.

20. The field-repairable SOC device of claim 19, wherein said multiplexor is further configured to:
receive said power-on-reset signal; and
output a signal which follows said power-on-reset signal to said pull-down transistor upon deactivation of said program_enable signal.

21. A method to package a field-repairable system-on-a-chip (SOC) device at a factory, comprising:
repairing said SOC device, using one or both of redundant rows and columns, prior to packaging said device;
marking usage of all redundant rows and columns, wherein said marking comprises blowing usage indicators corresponding to said redundant rows and columns;
retesting said SOC device; and
packaging said SOC device in response to said SOC device completing said retesting step satisfactorily.

22. The method of claim 21, wherein said repairing step comprises performing laser blown repairs on said redundant rows and columns.

23. A method to field repair a field-repairable system-on-a-chip (SOC) device at a factory, comprising:
performing a diagnostic test on said SOC device;
identifying unused redundant rows and columns;
electrically programming any of said unused redundant rows and columns, wherein said electrically programming comprises:
shifting in an address of a defective row or column to a scan chain; and
applying a programming power VPP to a electrically programming and sensing unit associated with said address shifted in said scan chain; and
retesting said SOC device.

24. The method of claim 23, further comprising usage marking any used redundant rows and columns during the electrically programming step.

* * * * *